Figure 1:
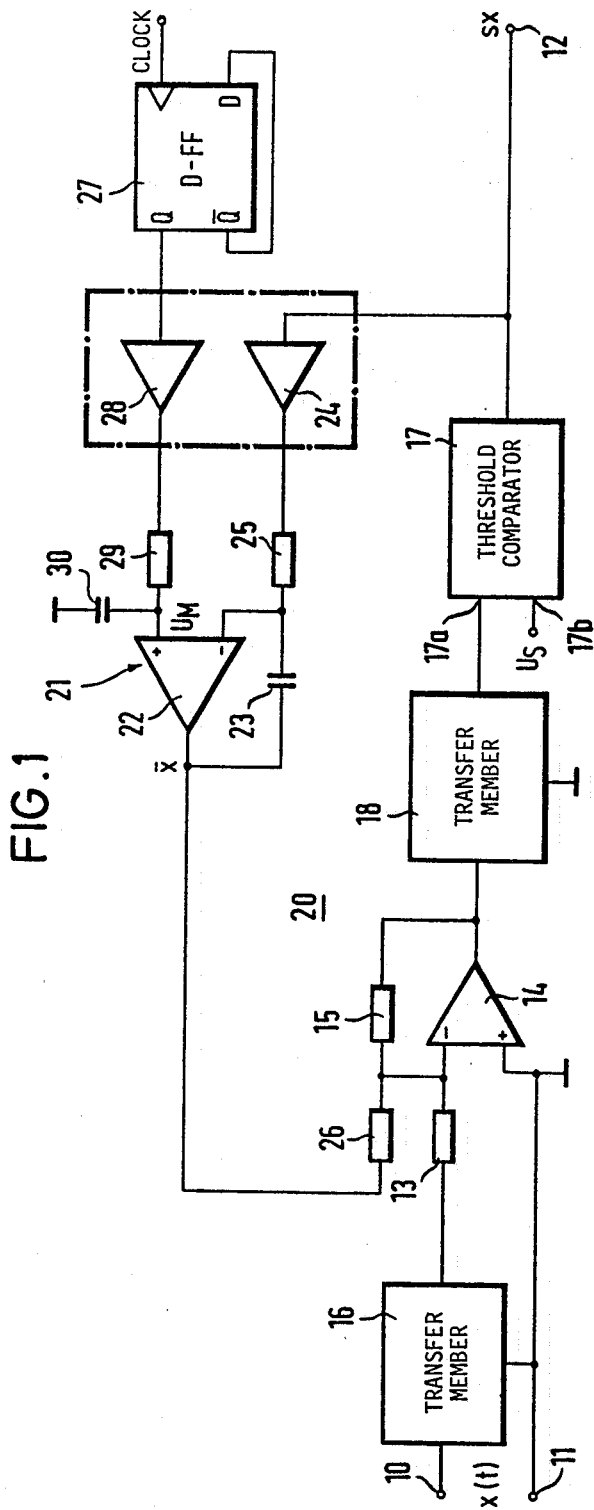

United States Patent [19]

Schneider et al.

[11] Patent Number: 4,963,872
[45] Date of Patent: Oct. 16, 1990

[54] METHOD AND ARRANGEMENT FOR GENERATING A MEAN-VALUE-FREE BINARY SIGNAL

[75] Inventors: Georg Schneider, Schopfheim-Langenau; Günter Freudig, Karlsruhe; Fernand Rippinger, Karlsruhe; Hans Braun, Karlsruhe, all of Fed. Rep. of Germany

[73] Assignee: Endress u. Hauser GmbH u. Co., Fed. Rep. of Germany

[21] Appl. No.: 94,821

[22] Filed: Sep. 9, 1987

[30] Foreign Application Priority Data

Oct. 3, 1986 [DE] Fed. Rep. of Germany ........ 3633768

[51] Int. Cl.⁵ ............................................. H03M 1/06
[52] U.S. Cl. ..................................... 341/142; 341/143; 341/118
[58] Field of Search .................. 340/347 AD, 347 NT; 341/118, 126, 142, 143, 155

[56] References Cited

U.S. PATENT DOCUMENTS 4,109,211  8/1978  Mese et al. .
4,263,555  4/1981  Hunka .
4,499,570  2/1985  Schouhamer Immink et al. .
4,540,897  9/1985  Takaoka et al. .
4,622,586  11/1986 Megeid .
4,724,419  2/1988  Kreuzer ...................... 340/347 AD

FOREIGN PATENT DOCUMENTS 0120474  10/1984  European Pat. Off. .
0124166  11/1984  European Pat. Off. .
0204897  12/1986  European Pat. Off. .
3240853  11/1982  Fed. Rep. of Germany .
3322850  2/1984   Fed. Rep. of Germany .
59-49014  3/1984  Japan .
1123054  8/1968   United Kingdom .
2048618  12/1980  United Kingdom .
2072981  10/1981  United Kingdom .
2085268  4/1982   United Kingdom .
2173378  10/1986  United Kingdom .

Primary Examiner—William M. Shoop, Jr.
Assistant Examiner—Marc S. Hoff
Attorney, Agent, or Firm—Barnes & Thornburg

[57] ABSTRACT

An arrangement for generating mean-value-free binary signals includes a binarizing circuit which receives an analog signal to be binarized and binarizes said signal with respect to a binarizing threshold. Connected to the output of the binarizing circuit is a closed-loop control circuit which includes a differential integrator which receives at the one input the binary signal from the output of the binarizing circuit. Applied to the second input of the differential integrator is a desired value signal which corresponds to the mean value between the two signal levels of the binary signal. The differential integrator integrates the deviation between the binary signal and the desired value signal and furnishes a signal corresponding to the integrated deviation. By the signal corresponding to the integrated deviation the position of the analog signal relatively to the binarizing threshold is shifted in a sense such that the mean value of the deviation is regulated to zero. For this purpose either the signal corresponding to the integrated deviation can be superimposed on the analog signal prior to the binarizing or the binarizing threshold can be varied by the signal corresponding to the integrated deviation. Preferably, the desired value signal is produced by integration of a mean-value-free binary signal.

14 Claims, 2 Drawing Sheets

METHOD AND ARRANGEMENT FOR GENERATING A MEAN-VALUE-FREE BINARY SIGNAL

The invention relates to a method for generating a mean-value-free binary signal by binarizing an anolog signal with respect to a binarizing threshold and an arrangement for carrying out the method.

Binarizing an anolog signal is carried out in that the analog signal is compared with a binarizing threshold and the binary signal is given the one signal value when it is above the binarizing threshold and the other signal value when it is below the binarizing threshold. A periodically sampled binary signal can be obtained in that instead of the analog signal periodic sampled values of the analog signal are compared with the binarizing threshold or the binary signal obtained by binarizing the analog signal is periodically sampled. In all cases the binary signal designates only the polarity or the sign of the analog signal with respect to the binarizing threshold.

In signal evaluating methods utilizing only the polarity of a signal in many cases the signal is required to be free of the mean value. Freedom from the mean value of an analog signal is defined in that the DC signal component (DC value) is zero, which means the same as that the areas lying above and below the zero line are of equal magnitude. The mean-value freedom of a binary signal is on the other hand defined in that the total times in which the binary signal assumes the one or the other state are of the same magnitude on an average With a periodic binary signal this is equivalent to saying that the binary signal assumes the two states with equal frequency This is therefore a time mean value in contrast to the voltage mean value which is governed by the DC signal component and which even with a binary signal free of the mean value in this sense is as a rule different from zero.

To fulfil the requirement for mean-value-free signals in such evaluating methods hitherto the analog signal was subjected prior to the binarizing to a high-pass filtering to suppress the DC signal components. This method has various disadvantages. Firstly, a high-pass filtering in no way ensures that the binary signal assumes the two signal values for equal total times, i.e. it is in turn free from the mean value as regards time and thus has the maximum information content Furthermore, if in the analog channel non-linearities or offset shifts take place the signal mean values relatively to the binarizing threshold are changed so that the instants of the changing over between the two signal values of the binary signal are displaced. In correlation methods this can lead to decorrelation.

The problem underlying the invention is to provide a method with which in the binarizing of an analog signal even when non-linearities or offset shifts exist in the analog channel a mean-value-free binary signal is always obtained.

According to the invention this problem is solved in that the binary signal obtained by binarizing the analog signal is compared with a desired value signal corresponding to the mean value between the two signal levels of the binary signal to determine the deviation, that the deviation is integrated, and that a signal corresponding to the integrated deviation shifts the position of the analog signal relatively to the binarizing threshold in a sense such that the mean value of the deviation is controlled to zero.

The method according to the invention involves a control by which the position of the analog signal with respect to the binarizing threshold is set so that the integration signal obtained by integration of the binary signal is made equal to the voltage mean value between the two binary signal levels. When this state has been reached the binary signal fulfils the condition that the sum of the times in which it has one signal value on an average is equal to the sum of the times in which it has the other signal value. The binary signal is then free from the mean-value in the sense of the above definition. Since the method according to the invention does not aim at rendering the analog signal free from the mean value prior to the binarizing, non-linearities have no effect on the mean-value freedom of the binary signal provided that the non-linearities are monotone, i.e. either increase or decrease in monotone manner. Furthermore, offset displacements in the part of the analog channel lying in the control circuit are compensated by the control and this eliminates the need of offset equalization.

Advantageous further developments and embodiments of the method according to the invention and an arrangement for carrying out the method are characterized in the subsidiary claims.

Figure 2:
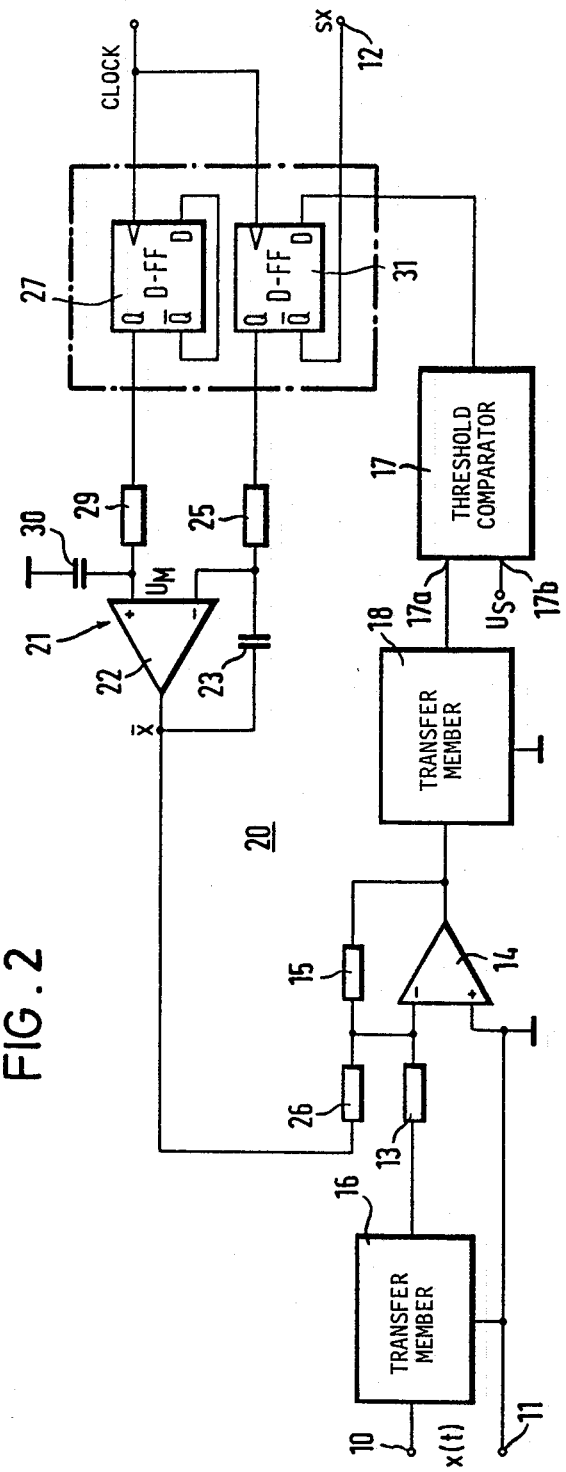

Further features and advantages of the invention will be apparent from the following description of an example of embodiment which is illustrated in the drawings, wherein: FIG. 1 shows the block circuit diagram of a circuit for generating a mean-value-free signal according to the invention and FIG. 2 shows a modified embodiment of the circuit of FIG. 1.

The circuit illustrated in FIG. 1 receives at the input terminals 10, 11 a time-variable analog signal x(t) and emits at the output 12 a binary signal sx which is obtained by binarizing the analog signal x(t). The binary signal sx can assume only two possible signal values which in accordance with the usual terminology are denoted at an H level and L level.

The analog signal x(t) is applied via a summation resistor 13 to the inverting input of a summation amplifier 14 in the feedback circuit of which a resistor 15 governing the gain is located The connection between the input 10, 11 and the summation amplifier 14 may contain a first transfer member 16.

The output of the summation amplifier 14 is connected to the signal input 17a of a threshold comparator 17 to the reference input 17b of which a threshold voltage $U_S$ is applied. In the connection between the summation amplifier 14 and the threshold comparator 17 a second transfer member 18 may be provided.

The threshold comparator 17 is constructed such that its output signal has the L level when the signal at the signal input 17a is above the threshold voltage $U_S$ whilst it has the H level when the signal at the signal input 17a lies below the threshold voltage $U_S$. The threshold comparator 16 thus effects the binarizing of the analog signal x(t), possibly modified by the transfer members 16 and 18, and its output signal represents the binary signal sx. This binary signal sx designates the sign or the polarity of the analog signal with respect to the binarizing threshold defined by the threshold voltage $U_S$.

The two levels of the binary signal sx may be selected as desired. Very frequently the L level will correspond to the zero level (ground potential) and the H level to a potential positive with respect to the ground potential This choice is however not imperative.

In many methods for evaluating binarized signals, in particular sign signals, it is assumed that the binary signal is free from the mean value "a binary signal" is termed "mean-value-free" when said signal assumes on an average the two possible signal values for the same period of time. The "mean-value freedom" of the binary signal thus refers to the time mean value which is to be distinguished from the "voltage mean value" in the usual sense. There is however a clear relationship between these mean values: The binary signal is free from the mean value as regards time when the voltage mean value lies exactly in the centre between the H level and the L level.

In the circuit illustrated the time mean-value freedom required for the binary signal is obtained by a closed-loop control circuit 20. The control circuit 20 includes a differential integrator 21 which is formed by an operational amplifier 22 in the feedback branch of which leading to the inverting input a capacitor 23 is provided. The output signal of the threshold comparator 17 is applied to the inverting input via a buffer stage 24 and a resistor 25. The output of the operational amplifier 22 is connected via a summation resistor 26 to the summation point at the inverting input of the summation amplifier 14.

Applied to the non-inverting input of the operational amplifier 22 is a desired or reference value voltage $U_M$. The differential integrator 21 integrates the difference between the desired value voltage and the binary signal sx and furnishes at the output a DC voltage $\bar{x}$ which varies its value proportionally to said difference. Said DC voltage $\bar{x}$ is added in the summation amplifier 14 to the analog signal; it varies with negative sign when the mean value $\overline{sx}$ of the binary signal $\overline{sx}$ is greater than the desired value voltage $U_M$ and with positive sign when the mean value $\overline{sx}$ is smaller than the desired value voltage $U_M$. By addition of said DC voltage $\bar{x}$ a DC signal component is superimposed on the analog signal prior to its binarizing so that the mean value of the analog signal is shifted with respect to the binarizing threshold. Since this shifting of the mean value of the analog signal also affects the changeover times between the signal values of the binary signal sx a closed control loop results which governs the time mean value of the binary signal.

The desired voltage value $U_M$ is so dimensioned that the binary output signal sx due to the control assumes the H level and the L level on an average for the same total times. It is easy to derive the necessary value of the reference voltage $U_M$ from this condition. The voltage mean value of a binary signal which on an average assumes the H level and the L level for identical total times lies exactly in the centre between the H level and the L level. If the voltage of the H level is denoted by $U_H$ and the voltage of the L level by $U_L$, then:

$$U_M = \tfrac{1}{2}(U_H + U_L)$$

When the desired value voltage $U_M$ at the non-inverting input of the operational amplifier 22 has this value under the action of the control at the output of the threshold comparator 17 a binary signal sx results whose voltage mean value is equal to the desired value voltage $U_M$. This means that the total time in which the binary signal sx has the H level on an average is equal to the total time in which it has the L level The binary signal sx is then free from the mean value as regards time.

The desired value voltage $U_M$ can be generated in any desired manner FIG. 1 shows however an arrangement for generating the desired value voltage $U_m$ which is particularly favourable. This arrangement includes a D flip-flop 27 to the clock input of which a periodic clock pulse sequence is applied The output $\overline{Q}$ of the D flip-flop is connected to the input D thereof. Since a D flip-flop of course for every pulse applied to the clock input assumes the state which is governed by the signal value present at the input D, the D flip-flop connected in the manner illustrated changes its state for each clock pulse. Consequently, at the output Q of the D flip-flop 27 a rectangular pulse sequence occurs whose recurrence frequency is equal to half the recurrence frequency of the clock pulses and in the rectangular pulse sequence the duration of each rectangular pulse is exactly equal to the duration of each pulse interval between two rectangular pulses. The rectangular pulse sequence thus has a duty factor of 1:2 since the duty factor is defined as the ratio of the pulse duration to the period duration. It is known to use a D flip-flop in the manner described as frequency divider stage. In the present case the D flip-flop serves as rectangular pulse generator.

The output Q of the D flip-flop 27 is connected via a buffer stage 28 to an integrating RC member comprising a resistor 29 and a capacitor 30. To the tap of the RC member the non-inverting input of the operational amplifier 22 is connected.

The two buffer stages 24 and 28 represent symbolically two equivalent outputs of an integrated digital circuit as indicated in FIG. 1 by the dot-dash box. These may for example be two buffer amplifiers or inverters formed in the same integrated chip. This configuration ensures that the binary output signals of the two buffer stages 24 and 28 assume the H level and the L level under exactly the same conditions irrespective of production tolerances, voltage fluctuations or external influences.

The output signal of the buffer stage 28 assumes alternately the H level and the L level in each case for exactly the same period of time. Thus, at the capacitor 30 of the integrating RC member 29, 30 there is a voltage $U_M$ which has exactly the previously defined voltage mean value between the voltage $U_H$ of the H level and the voltage $U_L$ of the L level The control circuit 20 shifts the mean value of the analog signal to be binarized so that the binary signal at the output of the buffer stage 24 assumes the same voltage mean value as the output signal of the buffer stage 28, i.e. this binary signal assumes on an average the H level and L level in each case for the same period of time. This fulfils the condition that the binary signal sx is free from the mean value as regards time.

A particular advantage of the circuit described is that the mean-value freedom occurs irrespective of intentional or unintentional non-linearities in the analog channel. It is therefore possible without any disadvantage to insert in front of the controlled system the transfer member 16 or insert the transfer member 18 into the controlled system and each of said transfer members can have any desired non-linear profile of the amplitude transfer function with the sole qualification that this profile must rise or fall in monotone manner. It is to be ensured that the sign of the control loop is retained in the sense of the correct mode of operation.

The circuit described has the further advantageous property that apart from a correction of the mean value all the offset voltages, such as the offset voltage of the summation amplifier 14, the offset displacements in the transfer member 18 and the offset voltage of the threshold comparator 17, are compensated by the control. Only the offset voltage of the differential integrator 21 remains as offset error; it may be however kept negligibly small with respect to the output levels of the digital buffer stages. Consequently, an offset equalization of the entire circuit is not necessary.

There are uses in which the binary signal appearing at the output of the threshold comparator 17 cannot be employed directly because periodic binary sampled values of the analog signal are required This is for example the case with digital polarity correlation when there is also the requirement that the periodic binary signals are mean-value free. The circuit described is also suitable for this case if following the threshold comparator 17 a sampling circuit is simply provided and the control conducted on the basis of the binary pulses obtained by the sampling.

FIG. 2 shows a modification of the circuit of FIG. 1 suitable for this purpose All the circuit components having the same function as in FIG. 1 are designated by the same reference numerals as in FIG. 1 and will not be described again.

In contrast to FIG. 1 the output of the threshold comparator 17 is connected to the input D of a D flip-flop 31 which receives at the clock input the clock pulse sequence which also controls the D flip-flop 27. The D flip-flop 31 assumes for each clock pulse the state defined by the signal value obtaining at the output of the threshold comparator 17 at the instant of the clock pulse. The D flip-flop 31 thus forms in this case a digital sampling circuit. At the output of the D flip-flop 31 a binary signal again appears which is derived by binarizing the analog signal x(t) and alternates between the H level and the L level but now the instants of the level transitions are no longer governed solely by the threshold comparator 17 but also by the clock signal; the time portions in which the binary signal has the H level or the L level are now integer multiples of the period duration of the clock signal.

As further modification of the circuit of FIG. 1 FIG. 2 shows that the two D flip-flops 27 and 31 themselves are formed in the same integrated chip and therefore can play the part of the buffer stages 24 and 28 so that said buffer stages are dispensed with.

The differential integrator 21 receives at its inverting input the binary signal from the output Q of the D flip-flop 31 so that the control circuit 20 now ensures that said binary signal assumes the H level and the L level on an average for identical total times. Since the binary signal is now periodically sampled this is equivalent to saying that it assumes the two possible states on an average equally frequently. The binary signal thus contains the maximum possible information for a polarity correlation.

The binary output signal sx can be taken from the output Q of the D flip-flop 31 or, as illustrated in FIG. 2, for better decoupling from the output $\overline{Q}$.

Various modifications of the circuit arrangements illustrated are possible without thereby impairing the method employed for generating a mean-value-free binary signal.

Thus, periodically sampled binary sampling values can be obtained not by a digital sampler 31 following the threshold comparator 17 as in FIG. 2 but also by providing an analog signal sampler in front of the threshold comparator 17. The threshold comparator 17 in this case does not binarize the complete analog signal but only the analog sampled values. The output signal of the threshold comparator 17 then represents directly a periodically sampled binary signal. If the output signal of the threshold comparator 17 is then supplied as in FIG. 1 to the differential integrator 21 the binary output signal is made mean-value-free by the control.

In all the examples of embodiment described above the mean value freedom of the binary signal is obtained in that the analog signal x(t) is shifted by the superimposing of the DC signal $\overline{x}$ in the summation amplifier 14 relatively to the fixed binarizing threshold defined by the threshold voltage $U_S$. This procedure is not imperative because the only important point is the mutual position of the analog signal and binarizing threshold. Thus, the same effect can be obtained by changing the binarizing threshold by the control whilst the analog signal remains uninfluenced. The variation of the binarizing threshold can be effected in that the threshold voltage $U_S$ is changed in dependence upon the DC signal $\overline{x}$. The circuit features necessary for this will readily obvious to the expert on the basis of his knowledge of the art.

We claim:

1. A method for generating a time-mean-value-free binary signal from an analog signal comprising the steps of generating a first binary signal by binarizing the analog signal with respect to a binarizing threshold, generating a desired value signal by integrating a time-mean-value-free second binary signal having the same signal levels as the first binary signal, comparing said first binary signal with said desired value signal to determine the deviation between the two signals, generating a control signal corresponding to the integrated deviation, and shifting the level position of the analog signal relative to the binarizing threshold by means of said control signal such that the voltage mean value of the deviation is regulated to zero.

2. A method according to claim 1 in which the control signal corresponding to the integrated deviation is superimposed on the analog signal prior to the binarizing.

3. A method according to claim 1 in which the second binary signal from which the desired value signal is generated by integration is a periodic binary signal which in each period assumed each signal value for half the period duration.

4. A circuit arrangement for generating a time-mean-value-free binary signal from an analog signal, comprising a binarizing circuit which receives the analog signal and which produces at an output a first binary signal obtained by binarizing the analog signal with respect to a binarizing threshold, a closed-loop control circuit connected to the output of said binarizing circuit, the closed-loop control circuit including a differential integrator which receives at a first input the first binary signal and at a second input a desired value signal generated by integrating a time-mean-value-free second binary signal having the same signal levels as the first binary signal, and means for shifting the level position of the analog signal relative to the binarizing threshold by means of the output signal of said differential integrator such that the voltage mean value of the deviation between the first binary signal and the desired value signal is regulated to zero.

5. A circuit arrangement according to claim 4 in which the output of the differential integrator is connected to a first input of a summation circuit which precedes the binarizing circuit and which receives the analog signal at a second input.

6. A circuit arrangement according to claim 4, further comprising a rectangular pulse generator which generates a periodic sequence of rectangular pulses in which the duration of each rectangular pulse is equal to the duration of each pulse interval, the rectangular pulse sequence being supplied as the second binary signal to the second input of the differential integrator.

7. A circuit arrangement according to claim 6, further comprising an RC integration member inserted between the output of the rectangular pulse generator and the second input of the differential integrator.

8. A circuit arrangement according to claim 6 in which the rectangular pulse generator comprises a frequency divider stage formed by a D-type flip-flop to the clock input of which a periodic clock pulse sequence is applied.

9. A circuit arrangement according to claim 6, further comprising a first digital buffer stage connected to the output of the binarizing circuit and a second digital buffer stage connected to the output of the rectangular pulse generator, the two digital buffer stages being components of a joint integrated chip.

10. A circuit arrangement according to claim 4 in which the binarizing circuit is formed by a threshold comparator.

11. A circuit arrangement according to claim 4 in which the binarizing circuit includes a threshold comparator and a sampling circuit controlled by a periodic clock signal.

12. A circuit arrangement according to claim 11 further comprising a digital sampling circuit controlled by a periodic cock circuit and connected behind the threshold comparator.

13. A circuit arrangement according to claim 12 in which the digital sampling circuit is formed by a D-type flip-flop.

14. A circuit arrangement according to claim 16 in which the rectangular pulse generator comprises a frequency divider stage formed by a first D-type flip-flop to the clock input of which a periodic clock pulse sequence is applied, and in which the binarizing circuit includes a threshold comparator and a digital sampling circuit connected behind the threshold comparator and formed by a second D-type flip-flop to the clock input of which said periodic clock pulse sequence is applied, said two D-type flip-flops being components of a joint integrated chip.

* * * * *

UNITED STATES PATENT AND TRADEMARK OFFICE
CERTIFICATE OF CORRECTION

PATENT NO. : 4,963,872
DATED : October 16, 1990
INVENTOR(S) : Schneider et al.

It is certified that error appears in the above-identified patent and that said Letters Patent is hereby corrected as shown below:

In column 1, line 35, after "frequency", please insert --.--.
In column 1, line 48, after "content", please insert --.--.
In column 2, line 46, after "located", please insert --.--.
In column 3, line 37, replace "sx" with --sx--.
In column 3, line 68, after "level", please insert --.--.
In column 4, line 8, after "applied", please insert --.--.
In column 8, line 17, replace "16" with --6--.

Signed and Sealed this

Twenty-eighth Day of January, 1992

Attest:

HARRY F. MANBECK, JR.

*Attesting Officer*   Commissioner of Patents and Trademarks